United States Patent [19]

Coppola et al.

[11] 4,427,969

[45] Jan. 24, 1984

[54] INTERFACE CIRCUIT FOR A METER READING DEVICE

[75] Inventors: Vincent G. Coppola, Branford; John L. Lorenzo, Southbury, both of Conn.

[73] Assignee: Pitney Bowes Inc., Stamford, Conn.

[21] Appl. No.: 134,737

[22] Filed: Mar. 28, 1980

[51] Int. Cl.³ .......................................... H03K 13/02
[52] U.S. Cl. ...................... 340/347 AD; 340/347 CC; 340/347 M; 235/101
[58] Field of Search ........... 340/347 AD, 347 M, 183; 370/77

[56] References Cited

U.S. PATENT DOCUMENTS

| | | | |
|---|---|---|---|
| 3,746,843 | 7/1973 | Wesner | 235/92 EA |
| 4,050,062 | 9/1977 | Crocker et al. | 370/77 X |
| 4,286,144 | 8/1981 | Pollak, Jr. et al. | 235/101 |

FOREIGN PATENT DOCUMENTS

| | | |
|---|---|---|
| 857510 | 12/1960 | United Kingdom . |
| 1127283 | 9/1968 | United Kingdom . |
| 1190631 | 5/1970 | United Kingdom ./ |
| 1427301 | 3/1976 | United Kingdom . |
| 1466490 | 3/1977 | United Kingdom . |
| 2008350 | 5/1979 | United Kingdom . |
| 2017439 | 10/1979 | United Kingdom . |

OTHER PUBLICATIONS

The Engineering Staff of Analog Devices, Inc., Analog-Digital Conversion Handbook, 6/1972, pp. I-26 to 33; I-40 to 47; II-1 to 12.
Schmid, Electronic Analog/Digital Conversions, Van Nostrand Reinhold Co., 1970, pp. 396-407.
RCA Solid State Division, CA3162E A/D Converter for 3-Digit Display, Data Sheets, 4/1979, pp. 1-8.

Primary Examiner—T. J. Sloyan
Attorney, Agent, or Firm—Robert H. Whisker; David E. Pitchenik; William D. Soltow, Jr.

[57] ABSTRACT

An encoder is provided for a postage meter having a lever which is movable between postage value selecting positions. The encoder monitors movement of the meter setting lever by providing an electrical signal which varies in response to movement of the meter setting lever from one of the positions to another of the positions. Calibration can be performed so that the electrical signal indicative of the meter setting lever positions is truly representative of the positions.

3 Claims, 7 Drawing Figures

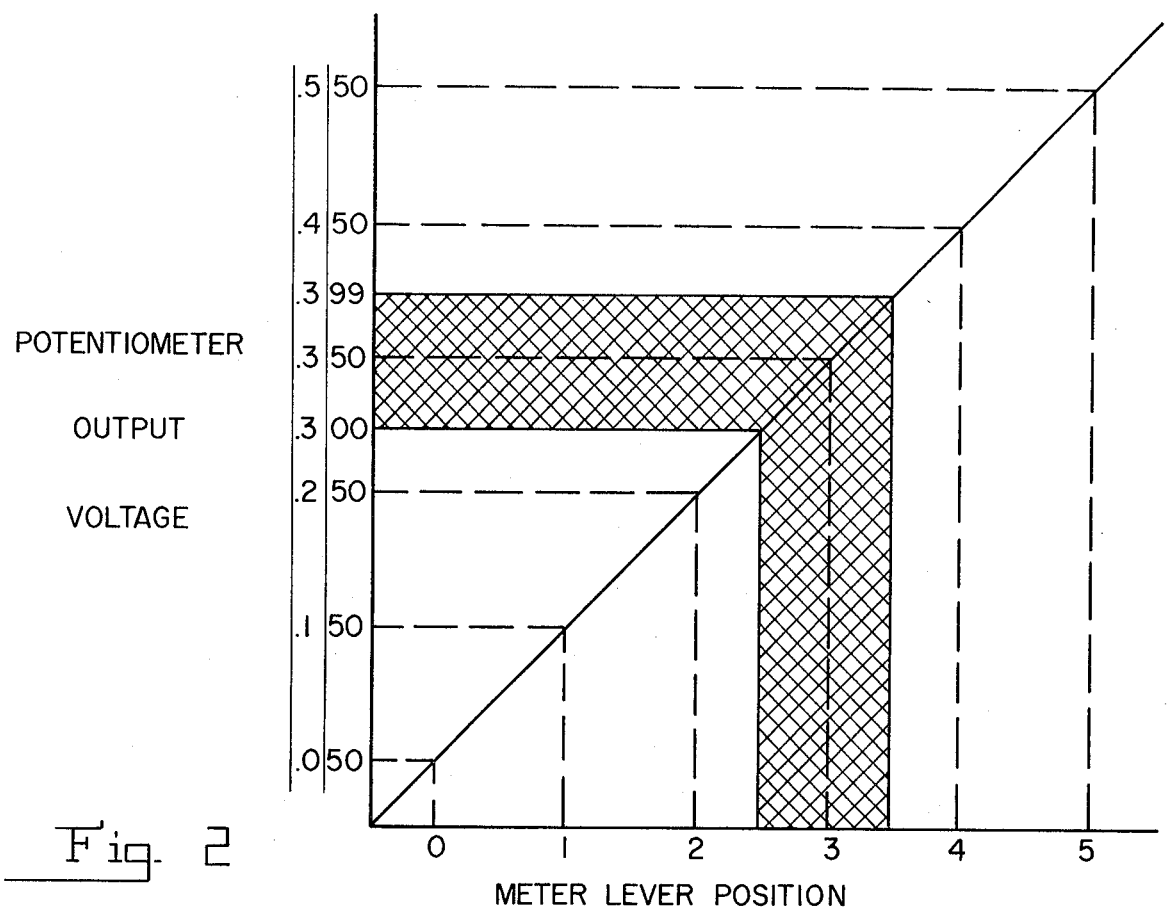

Fig. 5
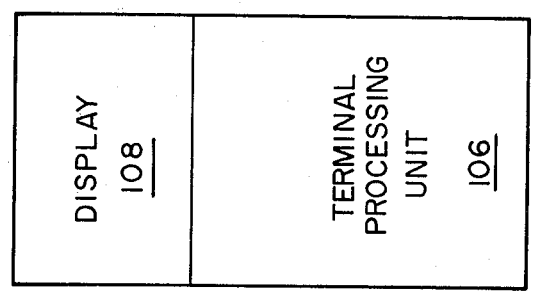
Fig. 3B
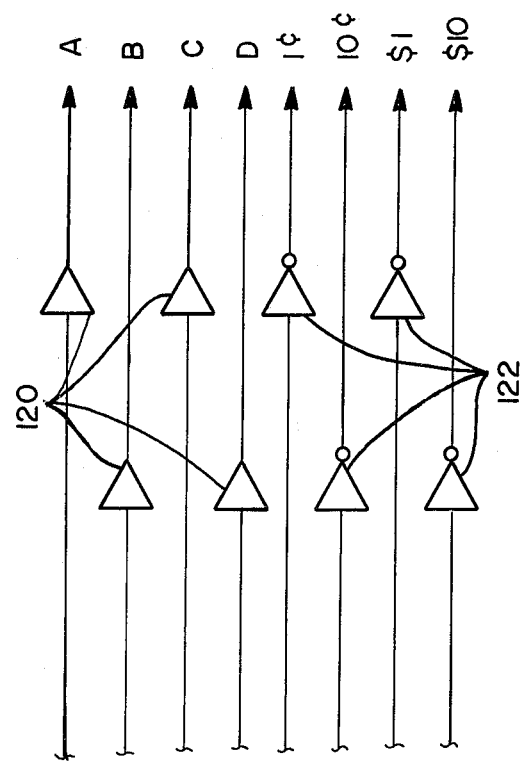

INTERFACE CIRCUIT FOR A METER READING DEVICE

BACKGROUND OF THE INVENTION

In recent years, the historically minor expenses attributable to utilization of the mails have significantly increased as a result of both direct and indirect mailing costs. As these expenses continue to spiral upwardly, the mailing habits of major industries are coming under closer scrutiny with a view to controlling such expenses. In this connection, many major manufacturers of postage meters and systems, including the assignee of the present invention, have recently introduced lines of meter-scale systems, which basically include a highly sensitive scale coupled to a postage meter which automatically prints the proper postage for franking the mailpieces weighed on the scale.

Other successful means have been devised for reducing indirect mailing costs. For example, the assignee of the present invention recently introduced a system for remotely resetting postage meters to eliminate the labor costs which would otherwise be incurred for hand-carrying postage meters to the local Post Office for resetting purposes.

With the above thoughts in mind, it should be appreciated that there is a need in the marketplace to provide suitable means for making a record of direct mailing costs on a current basis for cost analysis and other mail control purposes. In a typical office or corporate mailing room, a number of users have access to a single mailing machine and the postage meter associated therewith. In these situations, it is often desirable to account for the postage used by each person or department within the office. An automated system for providing this function is described in co-pending U.S. patent application, Ser. No. 108,061, filed Dec. 28, 1979, and assigned to the assignee of the present invention.

In the apparatus of the above identified application, an encoder is shown for use with a postage meter. The encoder has a lever which is movable among a plurality of postage value selecting positions. The encoder includes framework adapted for removably mounting the encoder in operating relationship with respect to the postage meter, and includes means for monitoring movement of the postage meter lever when the encoder is mounted in the operating relationship. The monitoring means includes means for providing an electrical signal which varies in response to movement of the postage meter lever from one of the positions to another of the positions.

The encoder includes transducer assemblies which include a conventional variable linear potentiometer with a stationary linear resistance. As a postage meter lever is moved from one position to another, the resistance of the potentiometer varies, thus varying the value of the electrical signal.

Since the postage meter levers may be moved to any one of ten discrete positions, zero through nine, the value of the potentiometer associated with each lever is read as a step function. Consequently, calibration of the encoder is important to ensure that values near the boundary of each step are not incorrectly interpreted. For example, without the proper calibration, a setting of the number five which is near the upper boundary of step five, may be interpreted as the number six. There is therefore a need for an accurate and simple meter reading device calibrator to ensure proper operation of the accounting system.

SUMMARY OF THE INVENTION

The present invention provides a new apparatus suitable for use in interfacing a postage meter with, for example, electronic accounting apparatus adapted for recording successive postage meter transactions. This apparatus interfaces a postage meter, of the type which includes a plurality of postage value selecting levers, with electronic accounting means. Means are provided for encoding the position of the postage value selecting levers of a postage meter; and an encoder is provided which includes means for monitoring movement of the postage value selecting levers of a postage meter, including means for providing a signal which varies in response to movement of the postage meter levers from one position to another. A meter reading device calibrator is provided to insure that the means for providing a signal responsive to the movement of the postage meter levers represents correct readings of the meter lever positions.

In accordance with the present invention, an accounting system for recording metered quantities chargeable to individual accounts is provided. The meter with which this system is adapted to work has settable means for setting quantities. Apparatus for calibrating a meter reading device for use with the meter comprises means for selecting positional data representative of the position of one of the settable means, means for converting the positional data to a digital value with a most significant digit and a next significant digit, and means for displaying the next significant digit.

BRIEF DESCRIPTION OF THE DRAWINGS

As shown in the drawing wherein like reference numerals designate like or corresponding parts throughout the several figures:

FIG. 2 is a graph of voltage versus lever position;

FIG. 3B is part of an electrical schematic diagram of the interface circuit for the meter reading device;

FIG. 4A is a table of binary coded decimal values transmitted over data line;

FIG. 4B is a table of values transmitted over digit select lines; and

FIG. 5 is a schematic diagram of the orientation of FIGS. 2A and 2B.

DETAILED DESCRIPTION OF THE PREFERRED EMBODIMENT

Figure 1:
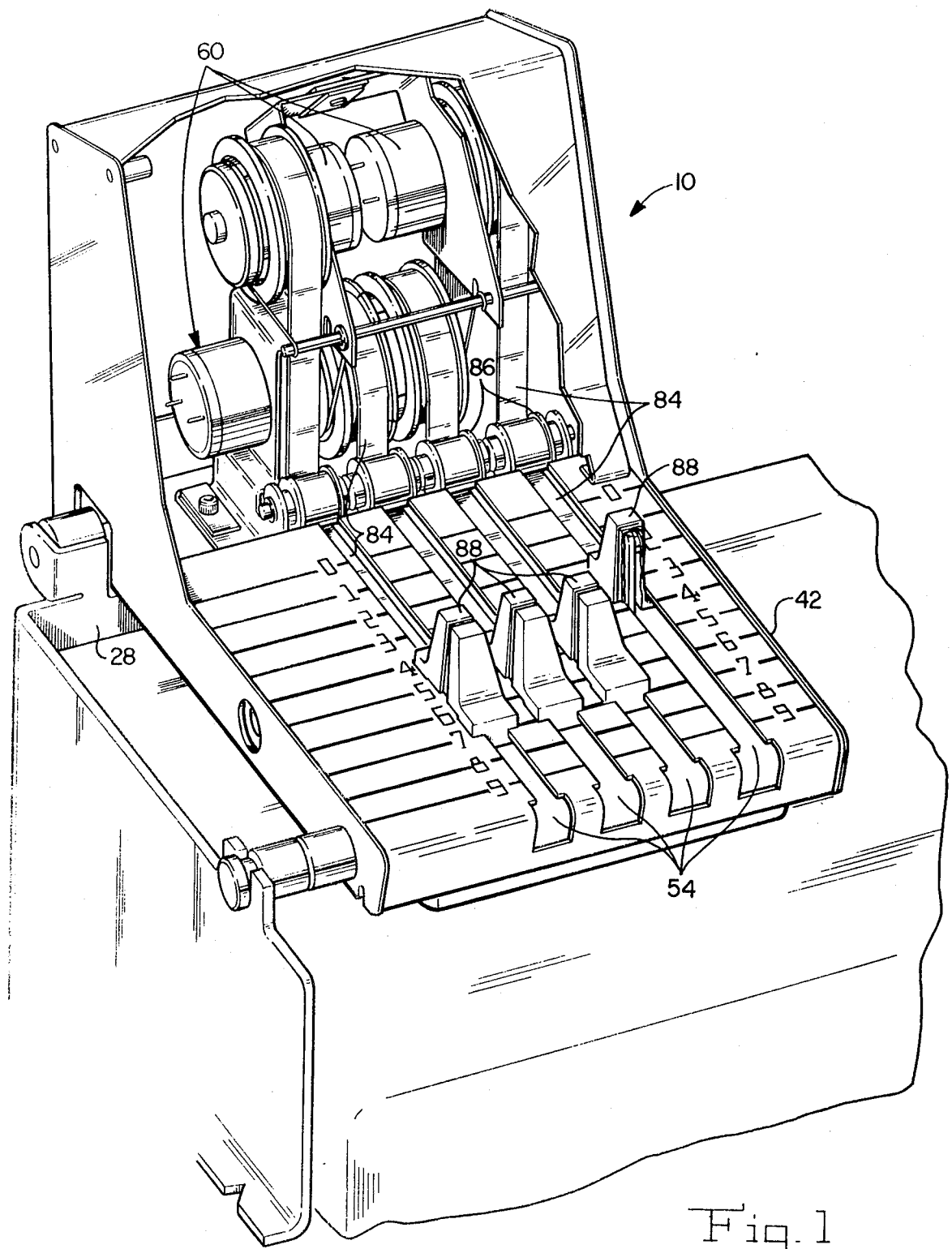
FIG. 1 is a fragmentary perspective view of an encoder according to the invention, shown mounted in operating relationship with respect to a postage meter.

Referring now to FIG. 1, there is shown an encoder 10 which includes meter setting levers 88 in individual tracks 54 corresponding to individual levers or banks of a postage meter. Potentiometers 60 are attached to the meter setting lever 88 by means of a metallic tape 84. as a meter setting lever 88 is moved along the face 42 of the encoder 10, the potentiometer 60 associated therewith is set to a new position.

Referring now to FIG. 2, there is shown a graph of the potentiometer 60 output voltage versus the meter setting lever 88 position on the encoder 10. Due to the fact that the encoder 10 is based on an analog system, a discrete location of the meter setting lever 88 may correspond to a band of analog values, as indicated by the shaded portion of the graph. For example, a meter setting lever 88 set at position number 3 on the face 42 of the encoder 10 signifies a voltage value of between 0.300 volts and 0.399 volts.

The first digit of the values, indicated on the Y axis of FIG. 2, represents the one-digit output voltage. This voltage is directly transmitted to the system as the meter setting lever position on the encoder 10. For purposes of calibration, it is desirable to correlate a potentiometer output voltage of 0.350 volts to indicate the position of the meter setting lever 88 at location 3, as this is the midpoint location between adjacent locations 2 and 4 and provides an optimum safety band on either side of the nominal lever position.

Note that the first digit is known as the most significant (MSD), the second digit is known as the next significant digit (NSD), and the last digit is known as the least significant digit (LSD). On the graph of FIG. 2, the entire band between 0.300 and 0.399 volts is recognized as the number 3 setting position of the meter setting lever 88.

Figure 3A:
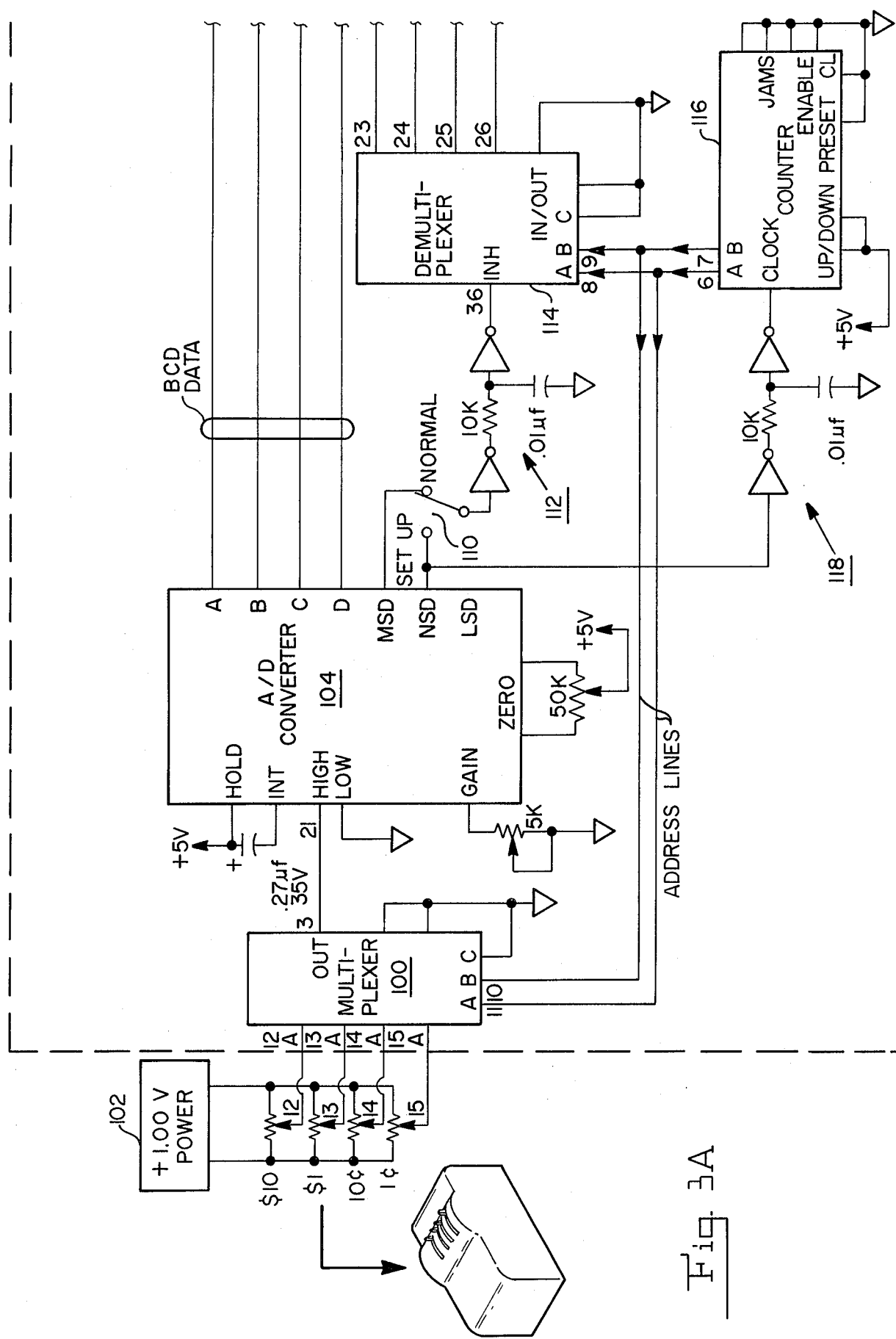
FIG. 3A is part of an electrical schematic diagram of the interface circuit for the meter reading device.

Referring now also to FIGS. 3A and 3B, the encoder 10 has lines from the potentiometers 60 to a multiplexer 100. The multiplexer 100 can be supplied by National Semiconductor Corporation as Part No. CD4051BM single eight channel analog multiplexer/demultiplexer. A power supply 102 provides a DC reference voltage of 1.000 volt to the potentiometers 60 of the encoder 10. The wipers of each potentiometer 60, are shown in FIG. 3A as reference numerals 12, 13, 14 and 15, are input to the multiplexer 100 over input ports numbers 12A, 13A, 14A and 15A, respectively. A line is connected from output port 3 of the multiplexer 100 to the input high port 21 of an analog to digital (A/D) converter 104. The A/D converter 104 can be supplied by RCA, Inc. as Part No. 3162 analog to digital converter.

The A/D converter contains provision for seven output ports as shown in FIG. 3A. There are four binary coded decimal (BCD) data ports, labeled A, B, C and D, and three digit select ports, labeled MSD, NSD and LSD. The four BCD data ports are ultimately tied to a terminal processing unit 106 (FIG. 3B), by BCD data lines and the terminal processing unit 106 is connected to a display 108.

Two of the digit select lines, MSD and NSD, are connectable by means of a set up switch 110 to delay circuitry 112. The delay circuit 112 is then input to the inhibit port INH 36 of a demultiplexer 114. The demultiplexer 114 can be supplied by National Semiconductor Corporation as Part. No. CD4051BM single eight channel analog multiplexer/demultiplexer. The output lines from the demultiplexer 114, labeled numbers 23, 24, 25 and 26 are ultimately connected to the terminal processing unit 106.

A counter 116, supplied by National Semiconductor Corporation as Part No. CD 4029BM, presettable binary/decade up/down counter is provided. Two lines output from the counter 116, labelled numbers 6 and 7, are used for address and tied to the demultiplexer 114 and the multiplexer 100. Delay circuitry 118 is provided between the counter 116 and the digit select line NSD of the A/C converter 104. Immediately prior to inputting signals to the terminal processing unit 106, signals are directed through buffers 120 to provide better drive capability for transmitting the signal from the transmitting device (the A/D converter 104) to the receiving device (the terminal processing unit 106). In addition, buffers 122 are inverting buffers to provide the same function as buffers 120 for the output from the demultiplexer 114.

In operation, an operator sets a postage meter to a value, for example $55.53. The three leftmost meter setting levers 88 are positioned at location number 5 and the rightmost meter setting lever 88 is positioned at location number 3 of the encoder 10, as shown in FIG. 1. The potentiometers 60 of the encoder 10 are automatically adjusted by means of the metal strap 84 to positions indicative of the meter setting lever 88 positions. Power is supplied by means of the power supply 102 across all four potentiometers 60 in parallel. The power supply 102 generates a reference voltage of 1.000 volt. Thus each potentiometer 60 acts as a voltage divider ranging from 0.000 volts to 1.000 volt. The signal from the wiper 12, 13, 14 or 15, of each potentiometer 60 is input to the multiplexer 100 over input lines to input ports shown in FIG. 3A as pins 12A, 13A, 14A and 15A. Address lines input to pins 10 and 11 of the multiplexer 100 determine which input port of the multiplexer 100 is to be connected to the output port, pin 3 of the multiplexer 100. Operation of these address lines is described in more detail hereinbelow.

If the address lines were set to 00, the multiplexer 100 would connect the signal coming from its pin 15A to its output pin 3, representing the value of the potentiometer 60 associated with the rightmost bank of the encoder 10. The rightmost bank of the encoder 10 is one cent (1¢) and successive leftmost banks of the encoder represent ten cents (10¢) one dollar ($1), and ten dollars ($10).

The data input to pin 15A of the multiplexer 100 is ideally 0.350 volts in this example. This is due to the fact that the rightmost bank of the encoder 10 is set to 3 (cents). Of course, a different address carried by the address lines to pins 10 and 11 of the multiplexer 100 would direct the multiplexer 100 to select the signal from the other input ports, 12A, 13A or 14A.

Once the connection between the input pin 12A, 13A, 14A or 15A and output port 3 of the multiplexer 100 has been made, the signal representative of the setting of the rightmost bank of the encoder 10 is transferred to the A/D converter 104, port 21. The value 0.350 volts had been an analog signal which is now converted to a digital value. The MSD of this number is 3; the NSD is 5; and the LSD is 0. All three digits of the 0.350 volts signal are stored in the A/D converter 104.

The digits are individually and sequentially strobed from the A/D converter 104 through output BCD data ports A, B, C and D of the A/D converter 104. The four output ports are connected to BCD data lines and the information carried thereover is defined by one of the digit select ports, MSD, NSD and LSD.

Referring now also to FIG. 4A, there is shown a table for BCD to decimal conversion. The values shown for the output ports A, B, C and D of the A/D converter 104 are translatable to a digital value according to this table. For example, the digital value 3 is represented by the binary coded decimal 0011 in ports D, C, B and A, respectively.

Referring now to FIG. 4B, when a binary one is present in the most significant digit line, MSD of the A/D converter 104, the data present in the BCD data lines currently represents the most significant digit. Similarly, a binary one set on the NSD output port of the A/D converter 104 signifies that the data in the BCD data lines currently represents the next significant digit. In this example, as mentioned previously, the most significant digit is 3 and the next significant digit is 5. The signals over ports A, B, C and D of the A/D converter 104 are sent through buffers 120 to the terminal processing unit 106 and the display 108 for processing and display, respectively.

Set up switch 110 can be positioned in either of two positions. The first position, NORMAL, for normal operation, ties the output port MSD of the A/D converter 104 to the delay circuitry 112. The delay circuitry provides input to the inhibit INH 36 port of the demultiplexer 114 and acts as a noise filter to effect a blanking function during transient conditions of the A/D converter 104. The demultiplexer 114 is now apprised of the fact that the data on the BCD data lines represents the most significant digit. The demultiplexer 114 transmits a signal over its port 23 through buffer 122 to the terminal processing unit 106, indicating that the data over the BCD data lines is representative of the one cent (rightmost) bank of the encoder 10.

The NSD output port [NSD] of the A/D converter 104 is also ties over a delay circuit 118 for noise filtering to the counter 116. Signals are sequentially generated or strobed by the A/D converter 104 via its MSD, NSD and LSD digit select ports in a manner similar to the data strobing that occurs by the A/D converter A, B, C and D output data ports as hereinabove described. When the switch 110 is moved to its SET UP position, the signal generated by the NSD port of the A/D converter 104 is polled in the course of the aforementioned digit select port strobing. Each time the NSD signal is set, the counter 116 increments. This increment in turn transmits a signal over output pins 6 and 7 of the counter 116 to provide the address for both the multiplexer 100 and the demultiplexer 114. For each strobing cycle, however, the signal applied to the counter 116 via the delay circuit 118 is representative only of the NSD data output port value. This value is then repeatedly applied to the display 108 so as to appear constant. The displayed value is used in calibrating the associated potentiometer 60 by a method hereinbelow described. As the counter 116 increments, the signal over the address lines input to the multiplexer 100 through ports 10 and 11 instructs the multiplexer 100 to accept the data input over the next input line, in this case its port 14A, which is data representative of the second (ten cent) bank of the encoder 10. This information, representative of the data in the ten cent bank, is then connected by the multiplexer 100 to its output port, port 3.

The counter 116 also generates address information over its output ports 6 and 7 to the demultiplexer 114 through the demultiplexer input ports 8 and 9. The demultiplexer 114 uses this information to indicate to the terminal processing unit 106 over demultiplexer line 24 and through buffer 122 that this new information is now representative of the setting of the ten cent bank of the encoder 10.

In a similar manner, the system increments through all four banks of the encoder 10, from the one cent to the ten dollar bank, sequentially and continuously.

As previously mentioned with respect to FIG. 2, there is an analog band of values associated with a discrete position of each meter setting lever 88. It is desirable to calibrate the potentiometers 60 associated with the encoder 10 so as to position the center of the analog band in direct correspondence to the discrete digital value representative of the meter setting lever. This is to ensure that possible errors caused by tolerance build up, changes in voltage supply, wear, and the like will be minimized. Without such calibration, it is possible that a meter setting lever on position 5 can be misinterpreted as position 6 or 4.

The set up switch 110 allows the system to consider either the most significant digit or the next significant digit of the data representative of the value of the meter setting lever 88 on the encoder 10. When set in its NORMAL position, the switch 110 permits only the most significant digit of the data to be accepted by the terminal processing unit 106 and displayed by the display 108. In the other, SET UP, position, the switch 110 allows a service representative to set the potentiometer 60 while viewing the next significant digit of the value. By viewing this next significant digit, the service representative is able to position the analog band of the potentiometer output voltage about the discrete detent of the meter setting lever indicator on the encoder 10. For any data over the BCD data lines of the A/D converter 104, calibration requires that the next significant digit should ideally be the number 5, which is the midpoint of the range between two consecutive values of the most significant digit. That is, when calibrating the setting for the meter setting lever 88 at position 3, the MSD and NSD values should be 3 and 5, respectively. Due to non-linearity of the projection of the meter setting lever 88 trajectory on the face 42 of the encoder 10, the midpoint of two most significant digits is not always at NSD position 5. For example, after calibration, the NSD at position 0 will be 3 or 4; the NSD at position 9 will be 6 or 7.

In practice, the set up switch 110 is set to the NORMAL position during calibration to provide a coarse adjustment of the potentiometer 60. The set up switch 110 is then set to its SET UP position, tying the output from the NSD port of the A/D converter 104 directly to the delay circuitry 112 which is input to the demultiplexer 114. The service representative can then finely adjust the potentiometer 60 to the appropriate NSD value, which indicates the center of the analog band of potentiometer output voltage values. This indicates that the analog band is now centered about the discrete meter setting lever detent of the encoder 10.

It should be understood that the term postage meter is used herein to refer to the general category of devices for imprinting a defined unit value for governmental or private carrier delivery of envelope or parcels, or other like application for unit value printing. Thus, the term is used as a general term for devices utilized in conjunction with services other than those exclusively employed by governmental postal services. The term encompasses, for example, private parcel or freight service meters.

There has been described apparatus for interfacing a postage meter with electronic accounting apparatus adapted for recording successive postage meter transactions, with means for calibrating the interfacing apparatus so that electrical signals indicative of meter setting levers on the postage meter are truly representative of the lever positions.

Inasmuch as certain changes may be made in the above described invention without departing from the spirit and scope of the same, it is intended that all matter contained in the above description or shown in the accompanying drawings shall be interpreted in an illustrative rather than limiting sense. Moreover, it is intended that the following claims be interpreted to cover all the generic and specific features of the invention herein described.

What is claimed is:

1. A circuit for interfacing a plurality of analog signals to a digital device, said analog signals being adjustable each to represent a physical parameter such as the positions of a corresponding plurality of levers, said circuit providing, in a first mode a first sequence of single digit digital signals, each of said first digital signals approximating one of said analog signals and providing in a second mode a second sequence of digital signals, each of which may be used to calibrate said adjustment of one of said analog signals, said circuit comprising:

(a) a free-running analog-to-digital conversion means for sampling an analog signal and providing a digital output, said digital output signal comprising a most significant digit which approximates said sample analog signal and a subsequent next significant digit which provides, in combination with said most significant digit, a more precise approximation of said sampled analog signal, said conversion means further comprising first and second digit select outputs to strobe said most and said next significant digits respectively;

(b) multiplexer means, having an address input and an output connected to the input of said converter means, for selecting one of said plurality of analog signals in accordance with the value of said address input for conversion by said conversion means;

(c) demultiplexer means, having an address input, a signal input and a plurality of output lines corresponding to said plurality of analog signals, for demultiplexing an input signal to provide an output strobe on one of said lines in accordance with the value of said demultiplexer means address input;

(d) sequencing means operatively associated with said address input for sequentially selecting each of said plurality of analog signals for conversion by said conversion means and for simultaneously selecting the corresponding one of said plurality of demultiplexer output lines, whereby said output strobes identify the correspondence between said digital output and said analog signals, said sequencing means being responsive to signals from said converter means for selecting the next of said sequence of analog signals; and (e) switch means for switching between said first and second modes, said switch means connecting said first digit select output of said converting means to said signal input of said demultiplexing means in said first mode and said second digit select output from said converter means to said signal input in said second mode, whereby said circuit provides a sequence of digital output signals each approximating one of said plurality of analog signals and output strobes on corresponding ones of said plurality of the demultiplexer output lines so as to identify the correspondence between said digital outputs and said analog signals and whereby in said first mode said output strobes identify the validity and correspondence of said most significant digits so that said digit may be strobed into said digital device, and said in second mode said output strobes identify the validity and correspondence of said next significant digit so that said analog signals may be adjusted in accordance with said next significant digit so that said analog signals more accurately represent said physical parameters.

2. The circuit as described in claim 1 wherein said most and next significant digits are binary code decimal outputs representing the first and second significant figures of the approximate value of said sample input.

3. A circuit as described in claim 1 or 2 wherein said sequencing means is responsive to said second digit select output from said converter means for selecting the next of said sequence and analog signals.

* * * * *